United States Patent
Zeng

(10) Patent No.: US 11,205,765 B2
(45) Date of Patent: Dec. 21, 2021

(54) OLED DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Xianxiang Zeng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 293 days.

(21) Appl. No.: 16/613,865

(22) PCT Filed: Sep. 19, 2019

(86) PCT No.: PCT/CN2019/106662
§ 371 (c)(1),
(2) Date: Nov. 15, 2019

(87) PCT Pub. No.: WO2020/232927
PCT Pub. Date: Nov. 26, 2020

(65) Prior Publication Data
US 2021/0367204 A1 Nov. 25, 2021

(30) Foreign Application Priority Data
May 23, 2019 (CN) .......................... 201910433628.3

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3244* (2013.01); *H01L 51/56* (2013.01); *H01L 2227/323* (2013.01)

(58) Field of Classification Search
CPC . H01L 51/5253; H01L 27/3244; H01L 51/56; H01L 2227/323; H01L 51/5256; H01L 51/5246
(Continued)

(56) References Cited

U.S. PATENT DOCUMENTS

2016/0013444 A1* 1/2016 Cheng et al. ....... H01L 51/5256
257/40
2019/0305244 A1 10/2019 Jiang et al.
2020/0044190 A1 2/2020 Luo

FOREIGN PATENT DOCUMENTS

| CN | 106981584 A | 7/2017 |
|----|-------------|--------|
| CN | 107204404 A | 9/2017 |

(Continued)

*Primary Examiner* — Thinh T Nguyen

(57) ABSTRACT

An organic light emitting diode (OLED) display panel including a TFT substrate is provided. The TFT substrate is provided with an OLED device layer thereon, and the OLED device layer is provided with a TFE encapsulation layer thereon. Two ends of the TFT substrate is respectively provided with a first retaining wall, which is provided with a first organic adhesive layer thereon. A transverse dimension of the first organic adhesive layer is greater than that of the first retaining wall disposed thereunder. Thus, a portion connecting the first organic adhesive layer and the first retaining wall are formed into a concave wedge-shaped structure. The OLED device layer and the TFE encapsulation layer are located between the two first retaining walls and the two first organic adhesive layers disposed thereon. A side encapsulation structure adopted can improve ability of the sides of the OLED display panel to block water and oxygen.

10 Claims, 2 Drawing Sheets

(58) Field of Classification Search
USPC .............................. 257/40, 687; 438/82, 99
See application file for complete search history.

(56) References Cited

FOREIGN PATENT DOCUMENTS

| | | |
|---|---|---|
| CN | 108428802 A | 8/2018 |
| CN | 109065763 A | 12/2018 |
| CN | 109285967 A | 1/2019 |
| CN | 109585676 A | 4/2019 |
| CN | 109768184 A | 5/2019 |

* cited by examiner

OLED DISPLAY PANEL AND MANUFACTURING METHOD THEREOF

FIELD OF THE INVENTION

The present invention relates to display technology, and more particularly to an organic light emitting diode (OLED) display panel and a manufacturing method thereof.

BACKGROUND OF THE INVENTION

It is known that organic light emitting diode (OLED) displays have many advantages, such as self-luminescence, low driving voltage, high luminous efficiency, short response times, high definition and contrast, nearly 180 degrees viewing angles, wide temperature range, flexible display, large area full-color display, and so on, so that OLED displays are widely used in the field of display, lighting, and smart wear.

Particularly, an OLED device is usually disposed on a thin film transistor array substrate (abbreviated as a TFT substrate), and includes an anode, a hole injection layer, a hole transport layer, an organic light emitting layer, an electron transport layer, an electron injection layer, and a cathode sequentially formed on the TFT substrate. The TFT in the TFT substrate is used as a switching device and a driving device of the OLED.

The significant difference between the OLED display and the traditional liquid crystal display is that the OLED does not need backlight, but two carriers of electrons and holes are injected into an organic light emitting layer and combined to emit light in the organic light emitting layer.

However, the OLED display also has a disadvantage that the organic light emitting layer is very sensitive to moisture and oxygen in the atmosphere. Electrochemical corrosion is likely to occur in the environment containing moisture and oxygen, thereby causing damage to the OLED device. Therefore, if there is external water and oxygen permeation, the life of the OLED device will be greatly reduced. In this regard, the industry uses an encapsulation structure to encapsulate the OLED to isolate the external water and oxygen, so as to protect the internal OLED device.

Currently, one mainstream OLED encapsulation method in the industry is thin film encapsulation (TFE) to prevent moisture and oxygen from entering the OLED. However, the medium and large size panel TFE has poor reliability, which easily leads to entry of external water and oxygen, thereby causing failure of the organic light emitting layer therein.

Thus, it is indeed necessary to develop a new-type OLED display panel to overcome the deficiencies in the prior art.

SUMMARY OF THE INVENTION

Technical Problems

An aspect of the present invention provides an OLED display panel, which adopts a new encapsulation structure to enhance the ability of the OLED display panel encapsulation structure to block water and oxygen, wherein the new encapsulation structure is used for medium and large size OLED panel with poor reliability of TFE, which easily leads to the entry of water and oxygen, thereby causing the problem of the failure of the organic light emitting layer.

Technical Solutions

The technical solutions adopted by the present invention is as follows:

An OLED display panel includes a TFT substrate, wherein the TFT substrate is provided with an OLED device layer thereon. The OLED device layer is provided with a TFE encapsulation layer thereon, wherein two ends of the TFT substrate is further respectively provided with a first retaining wall, Each of the first retaining walls is provided with a first organic adhesive layer thereon, wherein a transverse dimension of the first organic adhesive layer is greater than a transverse dimension of the first retaining wall disposed thereunder, such that a portion connecting the first organic adhesive layer and the first retaining wall are formed into a concave wedge-shaped structure. The OLED device layer and the TFE encapsulation layer are located between the two first retaining walls and the two first organic adhesive layers disposed thereon.

Further, in other embodiments, a material used for the first retaining wall is SiNx.

Further, in other embodiments, the TFE encapsulation layer is spaced apart from the two first retaining walls and the first organic adhesive layer. The first organic adhesive layer is further provided with a curable adhesive layer thereon, and the curable adhesive layer fills down a space between the TFE encapsulation layer and the two first retaining walls and between the TFE encapsulation layer and the first organic adhesive layer.

Further, in other embodiments, a material used for the curable adhesive layer includes a thermally curable acrylic adhesive, but is not limited thereto.

Further, in other embodiments, the TFE encapsulation layer is located between the two curable adhesive layers, and an upper surface of the TFE encapsulation layer is flush with an upper surface of the curable adhesive layer.

Further, in other embodiments, inner sides of the two first retaining walls are further provided with two second retaining walls symmetrically disposed. The second retaining walls are spaced apart from the first retaining walls. The OLED device layer is located between the two second retaining walls. The curable adhesive layer fills a space between the first retaining walls and the second retaining walls.

Further, in other embodiments, a material used for the second retaining walls is SiNx.

Further, in other embodiments, each of the second retaining walls is provided with a second organic adhesive layer thereon.

Further, in other embodiments, a transverse width of the second organic adhesive layer is greater than a transverse width of the second retaining wall disposed thereunder. This makes the portion connecting the second retaining wall and the second organic adhesive layer thereon are formed into three structures, such as a more standard T-shaped wedge-shaped structure, a convex inverted L-shaped wedge-shaped structure, and a concave inverted L-shaped wedge-shaped structure, and the specific structure may be determined as needed, and are not limited.

Further, in other embodiments, the first organic adhesive layer and the second organic adhesive layer are made of the same organic adhesive material, such as photosensitive polyimide (PSPI), but are not limited thereto.

Further, in other embodiments, the OLED device layer and the TFE encapsulation layer are located between the two second retaining walls and the second organic adhesive layers disposed thereon.

Further, in other embodiments, the TFE encapsulation layer includes a first inorganic layer disposed at two sides of the OLED device layer, and a height of the first inorganic layer is lower than that of the OLED device layer.

Further, another aspect of the present invention provides a manufacturing method of the OLED display panel according to the invention, which includes the following steps:

A step S1, a TFT substrate is provided. A retaining wall layer is deposited on the TFT substrate, and an organic adhesive layer is coated on the retaining wall layer. The organic adhesive layer is etched and cured, thereby forming a first organic adhesive layer respectively located at two ends of the TFT substrate.

A step S2, the retaining wall layer is dry-etched to form the first retaining wall respectively located at two side ends of the TFT substrate. A transverse width dimension of the first retaining wall under the first organic adhesive layer is less than that of the first organic adhesive layer after dry-etching since a cured organic layer is more resistant to etching, thereby forming a concave wedge-shaped structure of a portion connecting the first retaining wall and the first organic adhesive layer.

A step S3, an OLED device layer is fabricated on the TFT substrate.

A step S4, a TFE film encapsulation layer is fabricated on the OLED device layer, wherein the TFE film encapsulation layer is located between the two first retaining walls and the first organic adhesive layer disposed thereon.

Further, in other embodiments, the method further includes a step S5 of forming a curable adhesive layer on the first organic adhesive layer, wherein a curable adhesive material is dripped on the first organic adhesive layer by inkjet printing, and then the curable adhesive material is cured to fix downward the wedge-shaped structure formed between the first organic adhesive layer and the first retaining walls.

Further, in other embodiments, in the step S1, for the etching of the organic adhesive layer, a second organic adhesive layer spaced apart from the first organic adhesive layer is further formed. Then, in the step S2, for the dry-etching of the retaining wall layer, the second retaining wall located under the second organic adhesive layer is further formed. A transverse width dimension of the second retaining wall is less than a transverse width dimension of the second organic adhesive layer disposed thereon, such that a portion connecting the second retaining wall and the second organic adhesive layer are formed into a wedge-shaped structure.

Further, in other embodiments, in the step S5, the dripped curable adhesive fills down between the first retaining walls and the second retaining walls.

BENEFICIAL EFFECTS

The invention relates to an OLED display panel, which is provided with a retaining wall made of columnar silicon nitride with better compactness at two ends of the TFT substrate thereof, and then combined with an organic adhesive layer disposed thereon. By replacing the existing side TFE encapsulation structure with the wedge-shaped structure formed by the combination of the two, the ability of the encapsulation at both sides of the display panel to block invasion of external water and oxygen can be effectively enhanced. At the same time, the TFE encapsulation structure is further disposed between the wedge-shaped structure at the two ends, and the property to block the invasion of water and oxygen can be further increased.

Further, the retaining walls enclose the TFE film encapsulation layer from both sides, which can effectively avoid the problem of water and oxygen permeation caused by the edge connected the existing TFE encapsulation layer and the TFT substrate being easy to fall off.

In addition, the use of the ultraviolet curable adhesive layer to fix downward the wedge-shaped structure formed by the retaining wall and the organic adhesive layer can further improve the encapsulation effect of the OLED device layer disposed on the TFT substrate. In this way, the reliability of the retaining wall encapsulation structure according to the present invention can be further improved, thereby avoiding the problem that the external water and oxygen are easily invaded, which leads to the failure of the organic light emitting layer.

DESCRIPTION OF DRAWINGS

In order to more clearly illustrate the technical solutions in the embodiments of the present invention, briefly describes the accompanying drawings required for describing the embodiments used in the following embodiments will be apparent in the following description of the accompanying drawings are merely some embodiments of the present invention, for ordinary skill in the art, without creative efforts, you can also obtain other drawings according to these drawings.

DETAILED DESCRIPTION OF THE PREFERRED EMBODIMENTS

The technical solutions of an OLED display panel and a method of manufacturing the same according to the present invention will be further described in detail below with reference to the accompanying drawings and embodiments.

Figure 1:
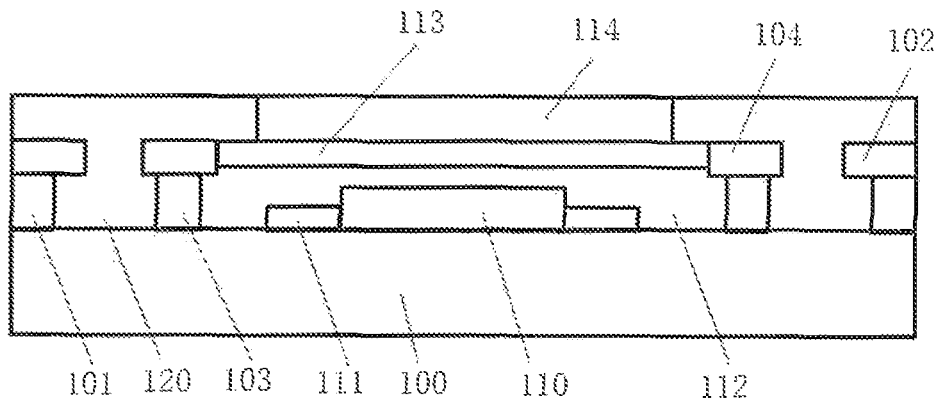
FIG. 1 is a schematic structural diagram of an OLED display panel according to an embodiment of the invention.

Referring to FIG. 1, an embodiment of the invention provides an OLED display panel including a TFT substrate 100. The TFT substrate 100 is provided with an OLED device layer 110 and a TFE encapsulation layer thereon, wherein the OLED device layer 110 specifically includes a hole injection layer, a hole transport layer, a light emitting layer, an electron transport layer, an electron injection layer, a cathode, and so on, and is not repeated here. The TFE encapsulation layer encapsulates the OLED device layer, which includes organic layers and inorganic layers alternately disposed.

Further, two ends of the TFT substrate 100 are relatively provided with first retaining walls 101 symmetrically disposed and second retaining walls 103 disposed inside the first retaining walls 101. The OLED device layer 110 and the TFE encapsulation layer are located between the two second retaining walls 103, The first retaining walls 101 and the second retaining walls 103 are preferably made of a SiNx material, but is not limited thereto. SiNx has better compactness and can effectively enhance ability of the encapsulation to block water and oxygen.

The first retaining wall 101 is provided with a first organic adhesive layer 102 thereon, and the second retaining wall 103 is provided with a second organic adhesive layer 104 thereon. A transverse width of the organic adhesive layer is greater than a transverse width of the retaining wall disposed thereunder, such that a wide upper and narrow lower configuration between the organic adhesive layer and the retaining wall is formed. The first organic adhesive layer 102 and the second organic adhesive layer 104 may be composed of various organic adhesive materials known in the industry, for example, photosensitive polyimide (PSPI), which can be specifically determined as needed, and are not limited.

Particularly, the first retaining wall 101 is located at the end of the TFT substrate 100, and one side of the first organic adhesive layer 102 disposed on the TFT substrate 100 cannot be extended out of the end thereof. Thus, a configuration of the first retaining wall 101 and the first organic adhesive layer 102 is inverted L shaped. On the other hand, the second retaining wall 103 is located inside the end of the TFT substrate, and two sides of the second organic adhesive layers 102 disposed on the TFT substrate 100 can be extended out of the side of the second retaining wall. Thus, the configuration of the second retaining wall 103 and the second organic adhesive layer 102 is T shaped.

In other embodiments, the configuration between the second organic adhesive layer 104 and the second retaining wall 103 is not limited to be T shaped. The configuration can be that only one side of the second organic adhesive layer 104 is extended out of one side of the second retaining wall 103, similar to the configuration of the first organic adhesive layer 102 and the first retaining wall 101, which can be specifically determined as needed, and are not limited.

The TFE encapsulation layer is disposed between the second retaining wall 103 and the second organic adhesive layer 104 disposed thereon, and the TFE encapsulation layer includes a first inorganic layer 111 disposed at two sides of the OLED device layer 110. The first inorganic layer 111 and the OLED device layer 110 are provided with a first organic layer 112 thereon. The first organic layer 112 is provided with a second inorganic layer 113 thereon. The second inorganic layer 113 is provided with a second organic layer 114 thereon. The TFE encapsulation layer in the figure is a four-layer structure, which is merely illustrative. In other embodiments, a number of stacked layers of the inorganic layers and the organic layers is not limited to four layers, which can be specifically determined as needed, and are not limited.

Further, the first retaining wall 101 and the second retaining wall 103, and the first organic adhesive layer 102 and the second organic adhesive layer 104 disposed thereon are further provided with an ultraviolet curable adhesive layer 120 thereon. The ultraviolet curable adhesive layer 120 includes two symmetrically disposed at two sides of the TFE encapsulation layer and fills down the space between the first retaining wall 101 and the second retaining wall 103 and between the first organic adhesive layer 102 and the second organic adhesive layer 104 thereon, wherein a material used for the ultraviolet curable adhesive layer 120 may be a thermally curable acrylic adhesive, but is not limited thereto.

Due to the transverse dimension feature between the first retaining wall 101 and the first organic adhesive layer 102, the configuration connecting the first retaining wall 101 and the first organic adhesive layer 102 is a wedge-shaped structure. The same wedge-shaped structure is also formed between the second retaining wall 103 and the second organic adhesive layer 104. Therefore, when the ultraviolet curable adhesive fills down, a wedge structure between the three is formed, thereby achieving the effect of sealing and fixing.

Further, a surface of the ultraviolet curable adhesive layer 120 is flush with a surface of the TFE encapsulation layer, together with the retaining wall structure having a double-layer hollow filled with the ultraviolet curable adhesive disposed at the lower portion of the TFE encapsulation layer, the two sides of the TFE encapsulation layer are encapsulated in an integral manner. Thus, the sides of the TFE encapsulation layer which is easily invaded by external water and oxygen is in a position isolated from the outside, and the TFE encapsulation layer only contacts the external environment on the upper surface. Therefore, the encapsulation effect of the two sides of the OLED device layer is effectively improved, and the problem of poor reliability of the TFE encapsulation layer and easy access of external water and oxygen, which leads to the failure of the organic light emitting layer thereof, can be avoided.

Figure 2:
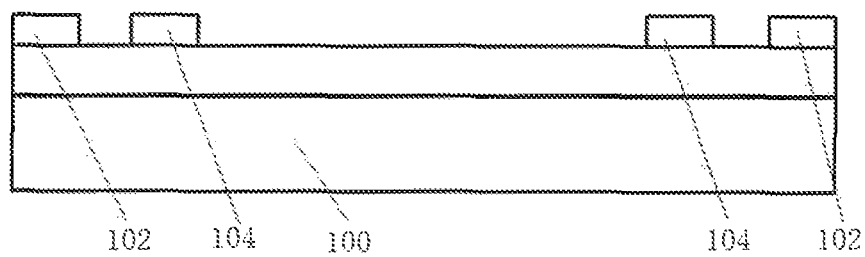
FIG. 2 is a schematic structural diagram after a step S1 is completed in a manufacturing method of an OLED display panel according to another embodiment of the invention.

Further, another embodiment of the invention provides a manufacturing method of the OLED display panel according to the invention, which includes the following steps:

A step S1, a TFT substrate 100 is provided. A SiNx layer is deposited on the TFT substrate 100, and an organic adhesive layer is coated thereon. The organic adhesive layer is patterned to form the first organic adhesive layers 102 spaced apart from the second organic adhesive layers 104. The first organic adhesive layers 102 are symmetrically disposed at two ends of the TFT substrate 100, and the second organic adhesive layers 104 are symmetrically disposed at an inner side of the first organic adhesive layers 102. The completed structure is illustrated in FIG. 2.

Figure 3:
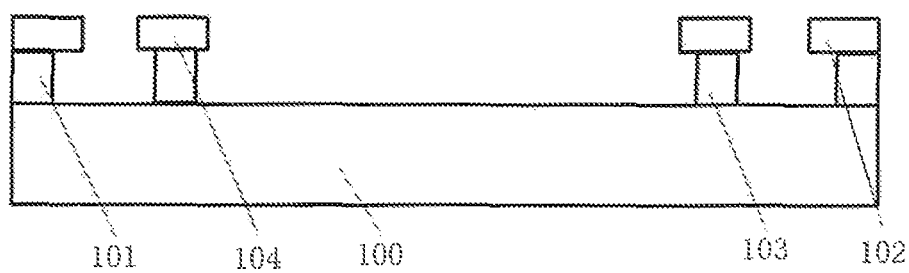
FIG. 3 is a schematic structural diagram after a step S2 is completed in the manufacturing method of the OLED display panel of FIG. 2.

A step S2, the SiNx layer is dry-etched. Since the cured organic adhesive layer has stronger etching resistance, the remaining SiNx layer under the organic adhesive layer is smaller in size than the organic adhesive layer thereon after dry-etching. That is, a transverse length of the etched silicon nitride layer is less than a transverse size of the organic adhesive layer thereon. Thereby, the etched silicon nitride layer and the organic adhesive layer are formed a wedge-shaped structure. Correspondingly, the first retaining wall 101 corresponds to the lower of the first organic adhesive layer 102, and the second retaining wall 103 corresponds to the lower of the second organic adhesive layer 104. The completed structure is illustrated in FIG. 3.

Figure 4:
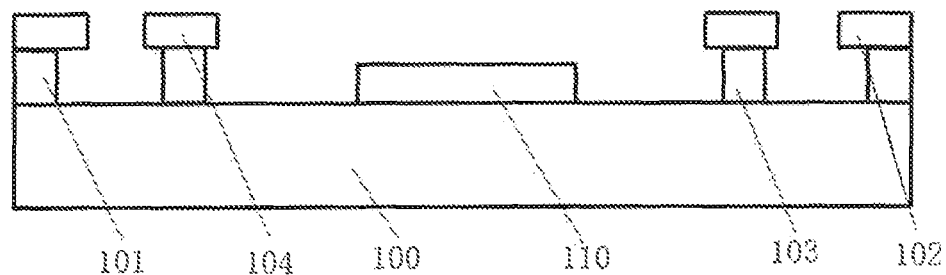
FIG. 4 is a schematic structural diagram after a step S3 is completed in the manufacturing method of the OLED display panel of FIG. 2.

S3, an OLED device layer 110 is fabricated on the TFT substrate 100, which specifically includes a hole injection layer, a hole transport layer, a light emitting layer, an electron transport layer, an electron injection layer, a cathode, and so on. The completed structure is illustrated in FIG. 4.

Figure 5:
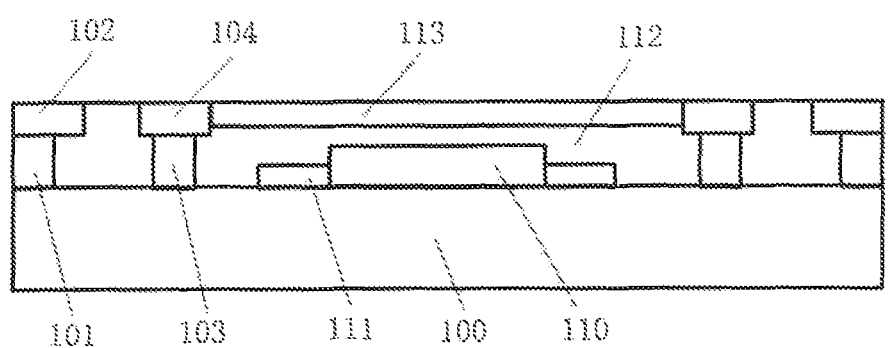
FIG. 5 is a schematic structural diagram after a step S4 is completed in the manufacturing method of the OLED display panel of FIG. 2.

S4, a TFE encapsulation layer is fabricated on the OLED device layer 110. First, first inorganic layers 111 are respectively disposed out of the two sides of the OLED device layer 110, A height of the first inorganic layer 111 is lower than that of the OLED device layer 110, so that a subsequent encapsulation ink can fill the size difference between the upper organic adhesive layer 104 and the lower second retaining wall 103 in the wedge-shaped structure. Then, a first organic layer 112 and a second inorganic layer 113 are sequentially deposited. The first organic layer 112 may encapsulate all the OLED device layer 110 and the first inorganic layer 111, but a height of an upper surface of the first organic layer 112 does not exceed a surface height of the second organic adhesive layer 104. The surface height of the second inorganic layer 113 disposed thereon is preferably equal to or slightly lower than the surface height of the second organic adhesive layer 104. The completed structure is illustrated in FIG. 5.

S6, the ultraviolet curable adhesive is dripped at two side ends of the TFT substrate 100 by inkjet printing respectively. The ultraviolet curable adhesive is rapidly cured under ultraviolet light, thereby fixing downward the wedge-shaped structure formed between the first organic adhesive layer 102 and the first retaining walls 101 and the wedge-shaped structure formed between the second organic adhesive layer 104 and the second retaining wall 103. After the curable adhesive is cured, the ultraviolet curable adhesive layer 120 at both ends completely covers downward the organic adhesive layer. Thereby, the end of the inner side of the ultraviolet curable adhesive layer is extended onto the second inorganic layer 113, but there will be a blank part in the middle. This part can be filled by depositing a second organic layer 114 in the TFE film encapsulation. Thus, the overall structure of the OLED display panel according to the invention is completed. The specific structure is illustrated in FIG. 1.

The invention relates to an OLED display panel, which is provided with a retaining wall made of columnar silicon nitride with better compactness at two ends of the TFT substrate thereof, and then combined with an organic adhesive layer disposed thereon. By replacing the existing side TFE encapsulation structure with the wedge-shaped structure formed by the combination of the two, the ability of the encapsulation at both sides of the display panel to block invasion of external water and oxygen can be effectively enhanced. At the same time, the TFE encapsulation structure is further disposed between the wedge-shaped, structure at the two ends, and the ability to block the invasion of water and oxygen can be further increased.

The technical scope of the present invention is not limited to the above description of the contents. Any person who skilled in the art may deform and modify the embodiment of the present invention within the spirit and scope of the appended claims, but these deformation and modification belong to the protection scope of the present invention.

What is claimed is:

1. An organic light emitting diode (OLED) display panel, comprising a TFT substrate, wherein the TFT substrate is provided with an OLED device layer thereon, and the OLED device layer is provided with a TFE encapsulation layer thereon;

wherein two ends of the TFT substrate is respectively provided with a first retaining wall, each of the first retaining walls is provided with a first organic adhesive layer thereon, wherein a transverse dimension of the first organic adhesive layer is greater than a transverse dimension of the first retaining wall disposed thereunder, such that a portion connecting the first organic adhesive layer and the first retaining wall are formed into a concave wedge-shaped structure;

wherein the OLED device layer and the TFE encapsulation layer are located between the two first retaining walls and the two first organic adhesive layers disposed thereon.

2. The OLED display panel according to claim 1, wherein the TFE encapsulation layer is spaced apart from the two first retaining walls and the first organic adhesive layer disposed at both sides of the TFE encapsulation layer, the first organic adhesive layer is further provided with a curable adhesive layer thereon, and the curable adhesive layer further fills down a space between the TFE encapsulation layer and the two first retaining walls and between the TFE encapsulation layer and the first organic adhesive layer.

3. The OLED display panel according to claim 2, wherein the TFE encapsulation layer is located between the two curable adhesive layers, and an upper surface of the TFE encapsulation layer is flush with an upper surface of the curable adhesive layer.

4. The OLED display panel according to claim 2, wherein inner sides of the two first retaining walls are further provided with two second retaining walls symmetrically disposed, wherein the OLED device layer is located between the two second retaining walls:

wherein the second retaining walls are spaced apart from the first retaining walls, the curable adhesive layer further fills down a space between the first retaining walls and the second retaining walls.

5. The OLED display panel according to claim 4, wherein each of the second retaining walls is provided with a second organic adhesive layer thereon.

6. The OLED display panel according to claim 5, wherein a transverse width of the second organic adhesive layer is greater than a transverse width of the second retaining wall disposed thereunder.

7. The OLED display panel according to claim 4, wherein the first retaining walls and the second retaining walls are both made of a SiNx material.

8. The OLED display panel according to claim 1, wherein the TFE encapsulation layer comprises a first inorganic layer disposed at two sides of the OLED device layer, wherein a height of the first inorganic layer is lower than that of the OLED device layer.

9. A manufacturing method of the organic light emitting diode (OLED) display panel according to claim 1, comprising:

a step S1 of providing a TFT substrate, depositing a retaining wall layer on the TFT substrate, and coating an organic adhesive layer on the retaining wall layer; etching and curing the organic adhesive layer, thereby forming a first organic adhesive layer respectively located at two ends of the TFT substrate;

a step S2 of dry-etching the retaining wall layer to form the first retaining wall respectively located at two side ends of the TFT substrate, a transverse width dimension of the first retaining wall under the first organic adhesive layer being less than that of the first organic adhesive layer after dry-etching since a cured organic layer is more resistant to etching, thereby forming a concave wedge-shaped structure of a portion connecting the first retaining wall and the first organic adhesive layer;

a step S3 of fabricating an OLED device layer on the TFT substrate; and a step S4 of fabricating a TFE film encapsulation layer on the OLED device layer, wherein the TFE film encapsulation layer is located between the two first retaining walls and the first organic adhesive layer disposed thereon.

10. The manufacturing method according to claim 9, further comprising a step S5 of forming a curable adhesive layer on the first organic adhesive layer, wherein a curable adhesive material dripped on the first organic adhesive layer by inkjet printing, and then the adhesive material is cured to fix downward the wedge-shaped structure formed between the first organic adhesive layer and the first retaining walls.

* * * * *